United States Patent
Tomioka et al.

(10) Patent No.: US 10,364,347 B2
(45) Date of Patent: Jul. 30, 2019

(54) EPOXY RESIN COMPOSITION, PREPREG, FIBER-REINFORCED COMPOSITE MATERIAL, AND HOUSING FOR ELECTRICAL OR ELECTRONIC EQUIPMENT

(75) Inventors: Masao Tomioka, Toyohashi (JP); Manabu Kaneko, Toyohashi (JP); Miyuki Hagiwara, Toyohashi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 251 days.

(21) Appl. No.: 14/006,168

(22) PCT Filed: Mar. 22, 2012

(86) PCT No.: PCT/JP2012/057300
§ 371 (c)(1),
(2), (4) Date: Sep. 19, 2013

(87) PCT Pub. No.: WO2012/128308
PCT Pub. Date: Sep. 27, 2012

(65) Prior Publication Data
US 2014/0010979 A1   Jan. 9, 2014

(30) Foreign Application Priority Data
Mar. 22, 2011 (JP) .................. 2011-062751

(51) Int. Cl.
| | |
|---|---|
| *C08L 63/04* | (2006.01) |
| *H05K 5/00* | (2006.01) |
| *C08J 5/24* | (2006.01) |
| *C08G 59/32* | (2006.01) |
| *C08K 5/21* | (2006.01) |
| *C08L 63/00* | (2006.01) |

(52) U.S. Cl.
CPC .......... *C08L 63/04* (2013.01); *C08G 59/3272* (2013.01); *C08J 5/24* (2013.01); *C08K 5/21* (2013.01); *C08L 63/00* (2013.01); *H05K 5/0091* (2013.01); *C08J 2363/04* (2013.01); *C08L 2205/02* (2013.01); *Y10T 428/1352* (2015.01); *Y10T 428/249945* (2015.04)

(58) Field of Classification Search
CPC .... Y10T 428/1352; Y10T 428/249945; C08G 59/3272; C08G 59/38; C08G 59/304; C08G 59/32; C08G 59/4014; C08G 59/4021; C08L 63/04; C08L 2205/02; C08L 63/00; C08L 63/06; C08J 5/24; H05K 5/0091

USPC .................................................. 525/521–527
See application file for complete search history.

(56) References Cited

U.S. PATENT DOCUMENTS

| | | | |
|---|---|---|---|
| 2006/0035088 A1* | 2/2006 | Takano et al. | 428/413 |
| 2008/0166511 A1 | 7/2008 | Honma et al. | |
| 2012/0071585 A1* | 3/2012 | Nohara et al. | 523/433 |
| 2012/0202071 A1* | 8/2012 | Kaneko | B29C 43/12 |
| | | | 428/413 |

FOREIGN PATENT DOCUMENTS

| | | |
|---|---|---|
| JP | 11 124489 | 5/1999 |
| JP | 11 166035 | 6/1999 |
| JP | 2008 214547 | 9/2008 |
| WO | 2004 048435 | 6/2004 |
| WO | 2005 082982 | 9/2005 |
| WO | 2010 109957 | 9/2010 |
| WO | 2010 140351 | 12/2010 |
| WO | WO 2010140351 A1 * | 12/2010 |

OTHER PUBLICATIONS

International Search Report dated May 29, 2012 in PCT/JP12/057300 Filed Mar. 22, 2012.

* cited by examiner

*Primary Examiner* — Lee E Sanderson
(74) *Attorney, Agent, or Firm* — Oblon, McClelland, Maier & Neustadt, L.L.P.

(57) ABSTRACT

To provide an epoxy-resin composition and prepreg for producing a fiber-reinforced composite material which exhibits excellent curability and has excellent flame retardance and heat resistance, as well as to provide fiber-reinforced composite materials produced using the prepreg and to provide housing for electronic/electrical devices. The epoxy resin composition contains component (A): a phosphorus compound; component (B): an epoxy resin which has at least three epoxy groups in the molecule, and which does not correspond to component (A) nor include component (A); component (C): an epoxy resin curing agent which does not have a urea structure in the molecule; and component (D): a dimethylurea compound represented by formula (a) (in formula (a), "R" is a hydrogen atom or an alkyl group having any number of 1 to 10 carbons).

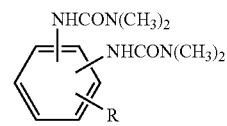

(a)

13 Claims, No Drawings

EPOXY RESIN COMPOSITION, PREPREG, FIBER-REINFORCED COMPOSITE MATERIAL, AND HOUSING FOR ELECTRICAL OR ELECTRONIC EQUIPMENT

TECHNICAL FIELD

The present invention relates to an epoxy resin composition, a prepreg, a fiber-reinforced composite material, and a housing for electronic/electrical devices. The present application is based upon and claims the benefit of priority to Japanese Patent Application No. 2011-062751, filed Mar. 22, 2011. The entire contents of the application are incorporated herein by reference.

BACKGROUND ART

Composite materials of resin and reinforcing fiber are used for various purposes because of their excellent properties such as light weight, rigidity and impact resistance. Especially, since carbon-fiber-reinforced composite materials are lightweight with highly strong and rigid features, they are used for a wide range of purposes, for example, sports/leisure applications such as fishing rods and golf shafts, industrial applications such as automobiles and aircraft, and so on. In recent years, since carbon fibers have magnetic wave shielding properties in addition to mechanical characteristics, carbon-fiber-reinforced composite materials are also used as housing for electronic/electrical devices such as laptop computers.

Flame retardance is one of the various properties expected when fiber-reinforced composite materials are used. For example, when used as housing for electronic/electrical devices, flame retardance is required in consideration of the potential for fire caused by heat generated in a device.

For setting fiber-reinforced composite material to be flame retardant, methods for adding brominated epoxy resin to the matrix resin have been widely employed. However, considering the toll on humans and the environment from toxic substances generated when resin compositions containing halogen are burnt, methods such as adding red phosphorus or phosphate compounds to epoxy resin (for example, patent publication 1), and adding phosphazene compounds to epoxy resin, for example, have been mainly employed recently as a way for obtaining flame retardance without using brominated epoxy resin. However, those methods have problems: 1) mechanical strength decreases when the amount of added substances increases; 2) storage stability is low; 3) red phosphorus, phosphate and phosphazene compounds seep out (bleed out) gradually over a long period; 4) hydrolysis of red phosphorus or phosphate compounds occurs easily; and 5) when the amount of added phosphate compounds or phosphazene compounds is large, the glass transition temperature (Tg) of cured material of the matrix resin is lowered, and the heat resistance of the cured material decreases. Accordingly, using the above methods, flame-retardant properties can be added to fiber-reinforced composite materials only to a certain degree, and their stability is low. Especially, considering the problem described in 4) above, it is difficult to apply such a method of using red phosphorus or phosphate compounds in the field of printed wiring boards or electronic materials where high insulation and water resistance are required.

To form a fiber-reinforced composite material, a method of using prepreg, which is an intermediate material formed by impregnating reinforcing fiber with thermosetting resin, is usually employed. A molded article made from fiber-reinforced composite material is obtained, for example, after the prepreg is cut and molded into a desired shape, and then is thermally cured in a die.

Epoxy-resin-based prepreg containing epoxy resin as a thermosetting resin is widely used. Since epoxy resin is hard to cure by itself, it is usually formulated with a curing agent or curing accelerator. However, even when formulated with the curing agent or curing accelerator, since the molding time is long (duration until the curing process is completed) for epoxy-resin-based prepreg, it is difficult to apply the prepreg to members requiring mass production such as automobile parts.

On the other hand, performing press molding at elevated temperatures and pressures is known as a high-cycle molding method with high productivity and is widely employed in automobile applications. In such a press molding, methods such as raising the molding temperature to reduce the curing time are employed to further enhance productivity. However, if the molding temperature is raised to be at least approximately 20° C. higher than the glass transition temperature (Tg) of the material to be cured, such a procedure results in a soft cured article. When the cured article is taken out from the molding die under such conditions, deformation or the like may cause problems. Therefore, it is necessary to cool the molding die before taking out the cured article from the die, which is not preferable considering the high-cycle aspect.

As epoxy-resin compositions capable of curing in a shorter period of time at lower temperatures, patent publication 2 discloses an epoxy-resin composition made of epoxy resin, an amine compound containing at least one sulfur atom in the molecule and/or a reacted product of epoxy resin and an amine compound containing at least one sulfur atom in the molecule, a urea compound, and dicyandiamide, along with prepreg produced made of such an epoxy-resin composition. Also disclosed in patent publication 2 is a method for forming fiber-reinforced composite material by press-molding the prepreg. As for urea compounds, 3-(3,4-dichlorophenyl)-1,1-dimethylurea or phenyl dimethyl urea is used.

However, more improvements should be made regarding the curability of the epoxy-resin composition above. In addition, the Tg of the obtained cured product is low, and its heat resistance needs to be improved.

PRIOR ART PUBLICATION

Patent Publication

Patent Publication 1: International Patent Publication Pamphlet 2005/082982
Patent Publication 2: International Patent Publication Pamphlet 2004/048435

SUMMARY OF THE INVENTION

Problem(s) to be Solved by the Invention

The present invention was carried out considering the above problems. Its objective is to provide an epoxy-resin composition and prepreg for producing fiber-reinforced composite material which exhibits excellent curability and has excellent heat resistance and flame retardance, as well as to provide fiber-reinforced composite materials produced using the prepreg and to provide housing for electronic/electrical devices.

Solution(s) to the Problem(s)

The present invention is characterized by the following.

[1] An epoxy-resin composition containing component (A), component (B), component (C) and component (D) described below:

the component (A): a phosphorus compound;

the component (B): an epoxy resin which has at least three epoxy groups in the molecule, and which does not correspond to component (A) nor includes component (A);

the component (C): an epoxy resin curing agent which does not have a urea structure in the molecule; and the component (D): a dimethylurea compound represented by formula (a) below. In such an epoxy-resin composition, the amount of substance of a urea group derived from component (D) is at least 0.25 times the amount of substance of phosphorus atoms derived from component (A), and the amount of component (A) to 100 parts by mass of the amount of the rest of the epoxy-resin composition that excludes component (A) is 7 parts by mass or greater.

[Formula 1]

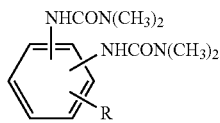

(a)

("R" is a hydrogen atom or an alkyl group having any number of 1 to 10 carbons)

[2] The epoxy-resin composition described in [1], in which component (A) is a phosphorus compound with a phosphorus atom content of at least 1.0 mass % but no more than 8.0 mass %.

[3] The epoxy-resin composition described in [1] or [2], in which component (A) is a phosphorus modified epoxy resin made of compound (b) represented by formula (b) below.

[Formula 2]

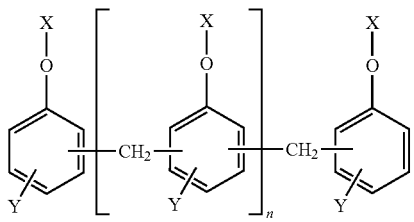

(b)

[In the formula, "n" is an integral number of zero or greater. "X" is a group shown in formulas (I), (II) or (III). In the formula, (n+2) X groups may be the same or different. However, at least one "X" among (n+2) X groups is a group shown in the above formula (I) or (II). "Y" represents (—H) or (—CH$_3$) bond, and (n+2) Y bonds in the formula may be the same or different.]

[Formula 3]

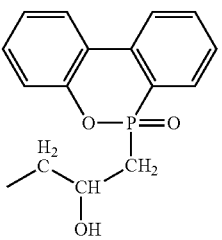

(I)

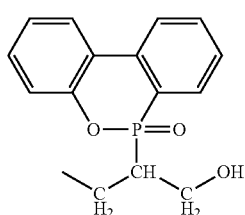

(II)

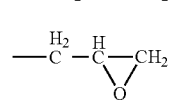

(III)

[4] The epoxy-resin composition described in any one of [1] to [3], in which the component (D) is 1,1'-(4-methyl-1,3-phenylene)bis(3,3-dimethylurea).

[5] The epoxy-resin composition described in any one of [1] to [4], in which the amount of substance of the urea group derived from component (D) is at least 0.48 times but no more than 0.90 times the amount of substance of phosphorus atoms derived from component (A).

[6] The epoxy-resin composition described in any one of [1] to [5], in which the amount of substance of the urea group derived from component (D) is at least 0.03 times but no more than 0.25 times the amount of substance of the epoxy group in the epoxy resin composition.

[7] The epoxy-resin composition described in any one of [1] to [6], in which the phosphorus atom content in the epoxy resin composition is at least 0.4 mass % but no more than 3.5 mass %.

[8] The epoxy-resin composition described in any one of [1] to [7], in which component (B) includes at least one selected from trisphenolmethane-type epoxy resin, aminophenol-type epoxy resin, diaminodiphenylmethane-type epoxy resin, novolac-type epoxy resin and their modified epoxy resins.

[9] The epoxy-resin composition described in any one of [1] to [8], in which the amount of component (B) is at least 18 parts by mass but no more than 100 parts by mass relative to 100 parts by mass of the entire amount of epoxy resin contained in the epoxy resin composition that excludes compound (A).

[10] The epoxy-resin composition described in any one of [1] to [8], in which the amount of component (B) is at least 58 parts by mass but no more than 100 parts by mass relative to 100 parts by mass of the entire amount of epoxy resin contained in the epoxy resin composition.

[11] The epoxy-resin composition described in any one of [1] to [10], in which compound (C) is dicyandiamide.

[12] The epoxy-resin composition described in any one of [1] to [11], further containing thermoplastic resin (E).

[13] The epoxy-resin composition described in [12], in which thermoplastic resin (E) is phenoxy resin.

[14] A prepreg formed by impregnating reinforcing fiber with the epoxy-resin composition described in any one of [1] to [13].

[15] A fiber-reinforced composite material obtained by curing the prepreg described in [14].

[16] A housing for an electrical/electronic device, in which the housing is partly or entirely formed using the fiber-reinforced composite material described in [15].

Effect(s) of the Invention

The embodiments of the present invention provide epoxy-resin compositions and prepreg which exhibit excellent curability and have excellent flame retardance and heat resistance without containing a halogen-based flame-retardant, red phosphorus, phosphate or phosphazene compound, while providing fiber-reinforced composite materials obtained using such prepreg, and providing housing for electronic/electrical devices.

MODE TO CARRY OUT THE INVENTION

In the following, the embodiments of the present invention are described in detail.
[Epoxy-Resin Composition]
Epoxy-resin compositions according to an embodiment of the present invention contain components (A) to (D) below as their necessary components.
<Component (A)>

A phosphorus compound as component (A) is not limited specifically as long as it contains a phosphorus atom in the molecule. Preferred compounds are red phosphorus and phosphate compounds such as phosphate esters, condensed phosphate esters and phosphaphenanthrene. Those phosphorus compounds may be taken into the skeletal formula of epoxy resins through curing reactions, or may be dispersed or dissolved in epoxy-resin compositions.

The relative density of red phosphorus is 2.2, lower than those of metal oxides. Since the content of phosphorus atoms that provide flame retardance is significantly great in red phosphorus, only a small amount of flame retardant is necessary to be added to obtain sufficient flame retardant effects.

To enhance stability, it is preferred to use a type of red phosphorus whose surface is coated by a metal hydroxide and/or resin. As for a metal hydroxide, aluminum hydroxide, magnesium hydroxide, zinc hydroxide, titanium hydroxide or the like is used. The type of resin and its coating amount are not limited specifically, but resins having high affinity properties with the base epoxy resin, such as phenolic resin, epoxy resin, polymethacrylate and the like, are preferred. In addition, the coating amount is preferred to be at least 1 wt. % but no more than 20 wt. % relative to 100 wt. % of red phosphorus. If the coating amount is less than 1 wt. %, sufficient coating effects are not obtained, and the resin may release phosphine gas while being kneaded at a high temperature. Such a coating amount is preferred to be great in terms of stability; however, it is preferred not to exceed 20 wt. % in terms of flame retardant effects and lightweight fiber-reinforced composite material.

Specific examples of phosphate esters are: triallyl phosphates, alkyl allyl phosphates, alkyl phosphates, phosphonates and the like. Examples of triallyl phosphates are triphenyl phosphate, tricresyl phosphate, trixylyl phosphate, cresyl diphenyl phosphate, cresyldi-2,6-xylenylphosphate, hydroxy diphenyl phosphate and the like. Examples of alkyl allyl phosphates are octyl diphenyl phosphate, and the like. Examples of alkyl phosphates are trimethyl phosphate, triethyl phosphate, tri-n-butyl phosphate, triisobutyl phosphonate, tris(2-ethylhexyl) phosphate, and the like. As for phosphonates, dimethyl methylphosphonate and the like are listed.

Examples of condensed phosphate esters are resorcinol bis(diphosphate), bisphenol-A bis(diphenyl) phosphate and the like.

The phosphorus atom content of component (A) is preferred to be at least 1.0 mass % but no more than 8.0 mass %. The higher the phosphorus atom content, the more enhanced is the flame retardance of a cured material containing the epoxy-resin composition, thus leading to improved flame retardance of the obtained composite material. The lower the phosphorus atom content, the more enhanced is the heat resistance of the cured product containing the epoxy-resin composition, thus leading to improved heat resistance of the obtained composite material.

Component (A) is preferred to be a phosphorus-modified epoxy resin made of compound (b) shown in formula (b) below. The epoxy-resin composition using the phosphorus-modified epoxy resin is more preferred since such a composition provides fiber-reinforced composite material having excellent curability and heat resistance, as well as excellent flame retardance without containing a halogen-based flame retardant, red phosphorus, phosphate or phosphazene compound.

[Formula 4]

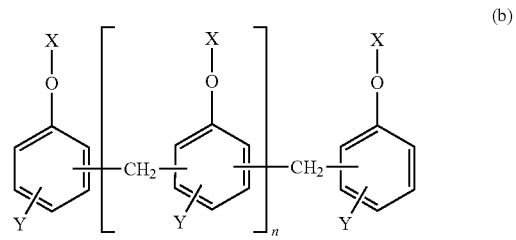

(b)

[In the formula, "n" is an integral number of zero or greater. "X" is a group shown in formulas (I), (II) or (III). In the formula, (n+2) X groups may be the same or different. However, at least one "X" among (n+2) X groups is a group shown in formula (I) or (II). "Y" represents (—H) or (—CH$_3$) bond, and (n+2) Y bonds in the formula may be the same or different.]

[Formula 5]

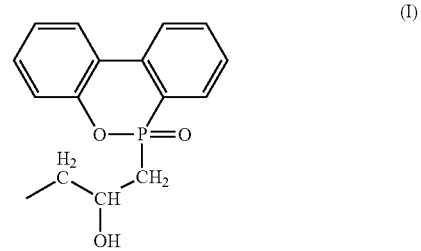

(I)

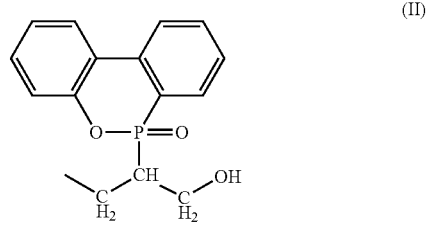

(II)

-continued

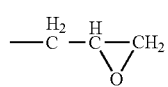
(III)

In formula (b), "n" is an integral number of zero or greater; "n" is preferred to be an integral number of 0 to 10, more preferably 0 to 5. If "n" is 10 or smaller, heat resistance and fluidity are well balanced.

Compound (b) in component (A) is one, or two or more. For example, component (A) may be formed only with a compound in which some of (n+2) X groups in formula (b) are those shown in formula (I) or (II), and some are groups as shown in formula (III). Alternatively, component (A) may be formed only with such a compound in which each of (n+2) X groups in formula (b) is a group as shown in formula (I) or (II). Yet alternatively, component (A) may be formed with a mixture of the following: a compound in which some of (n+2) X groups in formula (b) are groups as shown in formula (I) or (II) and some are groups as shown in formula (III); and another compound in which each of (n+2) X groups in formula (b) is a group as shown in formula (I) or (II).

It is an option for component (A) to use a commercially available product, or to use a product synthesized by a well-known method.

As for commercially available products, FX-289FA made by Nippon Steel Chemical Co., Ltd. is listed, for example.

Component (A) is prepared, for example, by the following method: epoxy resin, in which each of (n+2) X groups in formula (b) is a group as shown in formula (III) (for example, phenol novolac epoxy resins or cresol novolac epoxy resins), is reacted with a compound shown in formula (c) below (9,10-dihydro-9-oxa-10-phosphaphenanthrene-10-oxide) under high temperature using a catalyst.

[Formula 6]

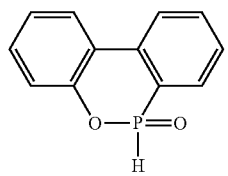
(c)

In the epoxy-resin composition according to an embodiment of the present invention, the amount of component (A) is preferred to be at least 7 parts by mass but no more than 100 parts by mass, more preferably at least 25 parts by mass but no more than 90 parts by mass, relative to 100 parts by mass of epoxy resin of the epoxy-resin composition that excludes component (A) (namely, component (B) and any other epoxy resin to be mixed in optionally). If the amount is 7 parts by mass or greater, excellent flame retardance is achieved. The amount is preferred to be 100 parts by mass or less. If the amount is set to be 100 parts by mass or less, appropriate heat resistance is provided to the cured material.

In addition, in the epoxy-resin composition according to an embodiment of the present invention, the amount of component (A) is preferred to be set so that the content of phosphorus atoms in the epoxy-resin composition is at least 0.4 mass % but no more than 3.5 mass %, more preferably at least 1.2 mass % but no more than 2.9 mass %. If the amount is 0.4 mass % or greater, excellent flame retardance is achieved. If the amount is 3.5 mass % or less, appropriate heat resistance is provided to the cured material.

<Component (B)>

Component (B) is an epoxy resin which contains at least three epoxy groups in the molecule, and which does not correspond to component (A) nor include component (A).

Examples of component (B) are phenol novolac epoxy resins, cresol novolac epoxy resins, DPP (diphenylolpropane) novolac epoxy resins, trisphenolmethane type epoxy resins, binaphthyl methane type epoxy resins, diaminodiphenylmethane type epoxy resins, aminophenol methane type epoxy resins, and modified epoxy resins of the above. Those resins may be used alone, or may be combined.

Component (B) is preferred to contain at least one resin selected from the following resins and their modified resins because they have excellent flame retardance and their cured materials have excellent heat resistance: trisphenolmethane type epoxy resin, aminophenol methane type epoxy resin, diaminodiphenylmethane type epoxy resin and novolac epoxy resin. It is more preferred for component (B) to contain at least one selected from trisphenolmethane type epoxy resin, diaminodiphenylmethane type epoxy resin and aminophenol methane type epoxy resin.

In the epoxy-resin composition according to an embodiment of the present invention, the amount of component (B) is preferred to be at least 18 parts by mass but no more than 100 parts by mass, more preferably at least 58 parts by mass but no more than 100 parts by mass, relative to 100 parts by mass of the epoxy resin contained in the epoxy-resin composition excluding component (A). By setting the amount of component (B) at 18 parts by mass or greater, sufficient heat resistance is obtained.

In the embodiments of the present invention, epoxy resin is defined as such a resin that has at least two epoxy groups in the molecule and its epoxy equivalent weight is 1400 g/eq or greater.

When component (A) has at least two epoxy groups in the molecule (for example, "n" in formula (b) is an integral number of at least 1 (the number for X is at least 3), and at least two X groups among (n+2) X groups are those as shown in formula (III)), and the epoxy equivalent weight of entire component (A) is 1400 g/eq or less, component (A) corresponds to epoxy resin.

When component (A) does not include a compound that contains two or more epoxy groups in the molecule, or when the epoxy equivalent weight of entire component (A) exceeds 1400 g/eq, component (A) does not correspond to epoxy resin.

<Component (C)>

Component (C) is an epoxy-resin curing agent that does not contain a urea structure in the molecule.

As for component (C), any conventionally known curing agent is used as long as it does not have a urea structure in the molecule and cures epoxy resin. Examples are amines, acid anhydrides, novolac resins, phenolic compounds, mercaptans, Lewis acid-amine complexes, onium salts, imidazole compounds and the like.

As for compound (C), amine-based curing agents such as amine or imidazole compounds are preferred. Examples of amine-based curing agents are: aromatic amines such as diaminodiphenylmethane and diaminodiphenyl sulfone; aliphatic amines, imidazole derivatives, dicyandiamide, tetramethylguanidine, thiourea added amines, and their isomers and modified compounds and the like.

Among those, dicyandiamide is preferred because it provides an epoxy-resin composition with potential for thermal activation, and offers excellent storage stability for the epoxy-resin composition.

Here, potential for thermal activation means the thermal activation of a composition is low at room temperature, but when certain thermal history is added, phase or chemical conversion is caused and the composition will be highly activated.

In the epoxy-resin composition according to an embodiment of the present invention, the amount of component (C) is preferred to be set in such a way that the ratio of the active hydrogen equivalent of component (C) is at least 0.4 but no more than 0.9, more preferably at least 0.5 but no more than 0.8, relative to the epoxy equivalent of the epoxy-resin composition excluding component (C). When the ratio is set at 0.4 or higher, excellent curability is provided for the epoxy-resin composition, and when it is set at 0.9 or lower, the rigidity of the obtained cured material is enhanced.
<Component (D)>

It is necessary for component (D) to be a dimethylurea compound as shown in formula (a) below.

[Formula 7]

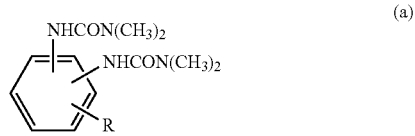

(a)

(R is a hydrogen atom or an alkyl group having any number of 1 to 10 carbon atoms.)

As for component (D), for example, 1,1'-(4-methyl-1,3-phenylene)bis(3,3-dimethylurea) or the like is listed.

Examples of commercially available component (D) are Omicure 24 (made by PTI Japan Ltd.) and the like.

In the epoxy-resin composition according to an embodiment of the present invention, the amount of component (D) is set so that the amount of substance of a urea group derived from component (D) is at least 0.25 times the amount of substance of phosphorus atoms derived from component (A). Namely, the ratio of the amount of substance of phosphorus atoms derived from component (A) to the amount of substance of the urea group derived from component (D) (hereinafter referred to as "urea equivalent to phosphorus") is 0.25 times or higher. If the ratio is set at 0.25 times or higher, excellent curability is obtained. It is preferred for the ratio to be set at 3.00 times or lower, since heat resistance is high. It is more preferable for the ratio to be set at 1.85 times or lower. It is also more preferable for the ratio to be set at 0.48 times or higher but 0.90 times or lower, since prepreg made of the resin composition is cured and molded at approximately 150° C. to form fiber-reinforced compound material, and deformation is less likely to occur even if the molded article is taken out shortly after it is molded.

In the epoxy-resin composition according to an embodiment of the present invention, the amount of component (D) is preferred to be set so that the amount of substance of a urea group derived from component (D) is at least 0.03 times but no greater than 0.25 times the amount of substance of the epoxy group in the epoxy-resin composition. If the ratio is set at 0.03 times or higher, excellent curability is obtained. If the ratio is set at 0.25 times or lower, excellent heat resistance is provided for the cured material. Hereinafter, the ratio of the amount of substance of the urea group derived from component (D) to the amount of substance of the epoxy groups contained in the epoxy-resin composition may be referred to as "urea equivalent to epoxy."

To control resin flow during the molding process or to provide toughness for the cured materials, epoxy-resin compositions related to the present invention may contain thermoplastic resin (E) within a range not to undermine the effects of the present invention.

Examples of thermoplastic resin (E) are polyamide, polyester, polycarbonate, polyethersulfone, polyphenylene ether, polyphenylene sulfide, polyetheretherketone, polyetherketoneketone, polyimide, polytetrafluoroethylene, polyether, polyolefin, liquid crystal polymer, polyarylate, polysulfone, poly acrylonitrile styrene, polystyrene, polyacrylonitrile, polymethyl methacrylate, ABS, AES, ASA, polyvinyl chloride, poly(vinyl formal), phenoxy resins and the like. Those may be each used alone, or two or more may be combined.

Among the resins above, phenoxy resins are preferred since they are excellent in resin-flow control, curability, flame retardance of cured material and the like.

It is an option for the epoxy-resin composition according to an embodiment of the present invention to contain an epoxy resin different from component (A) and component (B) above (hereinafter referred to as another epoxy resin) within a range that does not undermine the effects of the present invention.

Another epoxy resin is a type that does not correspond to component (A) while containing two epoxy groups in the molecule and having an epoxy equivalent weight of 1400 g/eq or less. Specific examples are bisphenol-based epoxy resins, alicyclic epoxy resins, epoxy resins with a biphenyl skeleton, naphthalene-based epoxy resins, isocyanate modified epoxy resins and the like. Those may each be used alone or two or more may be combined. Among them, bisphenol epoxy resins are especially preferred.

As for bisphenol-based epoxy resins, bisphenol A epoxy resins, bisphenol F epoxy resins, bisphenol E epoxy resins, bisphenol S epoxy resins and the like are listed. Any type may be used.

The epoxy-resin composition related to the present invention may contain various well-known additives within a range that does not undermine the effects of the present invention. As for such additives, for example, the following are listed: release agents such as silicone oil, natural waxes, synthetic waxes, metal salts of linear-chain fatty acids, acid amides, esters and paraffins; powders such as crystalline silica, fused silica, calcium silicate, alumina, calcium carbonate, talc and barium sulfate; inorganic fillers such as fiberglass and carbon fiber or the like; coloring agents such as carbon black and red-iron oxide; silane coupling agents or the like. Those additives above may be used alone, or two or more may be combined.
<Method for Preparing Epoxy-Resin Composition>

Epoxy-resin compositions related to the present invention are prepared by mixing each component described above.

For mixing each component, blenders such as three-roll mills, planetary mixers, kneaders, universal agitators, homogenizers, homo dispers or the like may be used.
[Prepreg]

The prepreg related to the present invention is made by impregnating reinforcing fiber with the epoxy-resin composition according to an embodiment of the present invention.

In the prepreg according to an embodiment of the present invention, the amount of the epoxy-resin composition to the entire weight of the prepreg (hereinafter referred to as resin content) is preferred to be at least 15 mass % but no more than 50 mass %, more preferably at least 20 mass % but no more than 45 mass %, even more preferably at least 25 mass % but no more than 35 mass %. If the resin content is less than 15 mass %, adhesiveness is reduced between the reinforcing fiber and the epoxy-resin composition, and if the resin content exceeds 50 mass %, flame retardance may decrease.

Reinforcing fibers are not limited to any specific type, and reinforcing fiber of fiber-reinforced composite material should be selected appropriately from well-known fibers according to usage purposes or the like. For example, various inorganic or organic fibers such as follows may be used: carbon fibers, aramid fibers, nylon fibers, reinforced polyester fibers, fiberglass, boron fibers, alumina fibers, and silicon nitride fibers. Among the above, carbon fibers, aramid fibers, fiberglass, boron fibers, alumina fibers or silicon nitride fibers are preferred when flame retardance is considered. Carbon fibers are especially preferred due to excellent specific strength, specific modulus and electromagnetic wave-shielding performance.

Carbon fibers are preferred to have strand tensile strength of at least 1.0 GPa but no more than 9.0 GPa, and strand tensile modulus of elasticity of at least 150 GPa but no more than 1000 GPa, both measured according to JIS R7601 (1986). It is more preferred for carbon fibers to have strand tensile strength of at least 1.5 GPa but no more than 9.0 GPa, and to have strand tensile modulus of elasticity of at least 200 GPa but no more than 1000 GPa.

As for the format of reinforcing fibers, fibers arrayed in one direction, woven fabrics or non-crimp fabrics may be selected.

The prepreg related to the present invention is formed by a well-known method using reinforcing fibers and the epoxy-resin composition according to an embodiment of the present invention.

The prepreg related to the present invention has excellent curability because it is made from the epoxy-resin composition according to an embodiment of the present invention. For example, the prepreg cures at a curing temperature of 140° C. within five minutes.

In addition, regarding the epoxy-resin composition according to an embodiment of the present invention, its cured material has a relatively high glass transition temperature (Tg), and exhibits excellent heat resistance. Accordingly, when the prepreg related to the present invention is molded by performing high-cycle press-molding under elevated temperature and pressure, the cured material is less likely to be soft so that removing the cured material from the molding die can be conducted in a short period of time without causing problems such as deformation.

Therefore, using the prepreg related to the present invention, fiber-reinforced composite material is produced in a relatively short period of time compared with fiber-reinforced composite material made from conventional epoxy-resin compositions. Therefore, the prepreg related to the present invention can be used for manufacturing members requiring high productivity.

[Fiber-Reinforced Composite Material]

The fiber-reinforced composite material related to the present invention is obtained by curing the prepreg above.

The fiber-reinforced composite material related to the present invention is preferred to contain carbon fibers as its reinforcing fibers, because carbon fibers are excellent in exhibiting flame retardance and heat resistance, electromagnetic wave-shielding performance, mechanical characteristics and the like.

The fiber-reinforced composite material related to the present invention is manufactured using the prepreg related to the present invention by a well known method, for example, by press-molding using a die.

For press-molding using a die, generally set conditions are a curing temperature of at least 100° C. but no higher than 150° C., molding pressure of at least 1 MPa but no higher than 15 MPa, and curing time of at least 1 minute but no longer than 20 minutes. Since the epoxy-resin composition according to an embodiment of the present invention has excellent curability as described above, it is molded by high-cycle press-molding, for example, at a curing temperature of 140° C. in a short period of time such as within 5 minutes.

The fiber-reinforced composite material related to the present invention exhibits excellent flame retardance even though it does not contain a halogen-based flame-retardant agent, red phosphorus or phosphate because the matrix resin is the cured material of the epoxy-resin composition according to an embodiment of the present invention. For example, when a 0.6 mm-thick sheet of fiber-reinforced composite material is formed, level V-0 flame retardance measured by UL-94V is achieved.

Accordingly, the fiber-reinforced composite material related to the present invention is suitable for applications that require a high level of flame retardance. Housing for electronic/electrical devices and interior materials for aircraft and automobiles are listed for such applications.

Also, the fiber-reinforced composite material related to the present invention exhibits excellent heat resistance.

Accordingly, the fiber-reinforced composite material related to the present invention is suitable for applications that require a high level of flame retardance and excellent heat resistance, and thus is especially suitable for housing for electronic/electrical devices.

[Housing for Electronic/Electrical Device]

Housing for an electronic/electrical device related to the present invention is formed partially or entirely using the fiber-reinforced composite material according to the embodiment described above.

"Electronic/electrical device" is a generic term for electronic devices and electrical devices. As for electronic/electrical devices, for example, personal computers (laptop or desktop), cell phones, electronic notebooks, portable music players, electronic book readers and the like are listed.

Housing for an electronic/electrical device related to the present invention may be formed using the fiber-reinforced composite material related to the present invention, or may also be formed using the fiber-reinforced composite material related to the present invention along with other material (such as metal, thermoplastic resin for injection molding or the like).

EXAMPLES

Next, the present invention is further described by referring to examples.

The following show materials (such as resin), methods for preparing epoxy-resin compositions, methods for forming carbon-fiber prepreg, methods for forming carbon-fiber composite material sheets, and evaluation methods for physical properties.

<Raw Material>

[Component (A)]

FX-289FA: phosphorus-modified epoxy resin product (a mixture of compounds where "Y" is (—H) and "n" is 0 to 8 in formula (b)), an epoxy equivalent weight of 7740 g/eq and phosphorus atom content of 7.4 mass %, made by Nippon Steel Chemical Co., Ltd.
[Component (B)]
TX-0911: liquid phenol novolac epoxy resin, epoxy equivalent weight of 172 g/eq, made by Nippon Steel Chemical Co., Ltd.
jER 152: liquid phenol novolac epoxy resin, epoxy equivalent weight of 177 g/eq, made by Mitsubishi Chemical Corporation.
jER 1032H60: trisphenolmethane-type epoxy resin, epoxy equivalent weight of 169 g/eq, made by Mitsubishi Chemical Corporation.
EPICLON N-540: modified trifunctional phenol novolac epoxy resin, epoxy equivalent weight of 170 g/eq, made by DIC Corporation.
jER 630: p-aminophenol epoxy resin, epoxy equivalent weight of 97 g/eq, made by Mitsubishi Chemical Corporation.
jER 604: diaminodiphenylmethane epoxy resin, epoxy equivalent weight of 120 g/eq, made by Mitsubishi Chemical Corporation.
[Other Epoxy Resins]
jER 828: liquid bisphenol A epoxy resin, epoxy equivalent weight of 189 g/eq, made by Mitsubishi Chemical Corporation.
jER 807: liquid bisphenol F epoxy resin, epoxy equivalent weight of 168 g/eq, made by Mitsubishi Chemical Corporation.
[Component (C)]
DICY 15: dicyandiamide, active hydrogen equivalent weight of 21 g/eq, made by Mitsubishi Chemical Corporation.
[Component (D)]
Omicure 24: 1,1'-(4-methyl-1,3-phenylene)bis(3,3-dimethylurea), made by PTI Japan
[Other Urea Compounds]
DCMU 99: 3-(3,4-dichlorophenyl)-1,1-dimethylurea, made by Hodogaya Chemical Co., Ltd.
Omicure 94: 1-phenyl-3,3-dimethylurea, made by PTI Japan Ltd.
Omicure 52: 4,4'-methylenebis(phenyl dimethyl urea), made by PTI Japan Ltd.
[Thermoplastic Resin (E)]
YP-70: phenoxy resin, made by Mitsubishi Chemical Corporation.
E2020P micro: polyethersulfone, made by BASF Japan Ltd.
[Carbon Fiber]
carbon fiber: Pyrofil TR50S15L, made by Mitsubishi Rayon Co., Ltd.
<Method for Preparing Epoxy-Resin Composition>
Epoxy-resin compositions in examples 1 to 28 and comparative examples 1 to 10 were prepared as follows.
According to their respective component amounts specified in Tables 1 to 6, first, component (C) and component (D) or other urea compounds as solid components, and jER 152 as a liquid component were measured in a container so that the mass ratio of the combined solid components to the liquid component is 1:1, and were then blended to be combined. The mixture was further combined thoroughly using a three-roll mill to obtain a masterbatch-type curing agent (instead of jER 152, jER 828 was used for examples 17 to 23, 26 and 27).
Next, among the component amounts specified in Tables 1 to 6, the rest of the components except for those used for the masterbatch-type curing agent were measured in a flask, and heated to 160° C. using an oil bath so that the mixture was dissolved and combined. Then, the mixture was cooled to approximately 65° C., to which their respective masterbatch-type curing agents were added and blended to be combined. Accordingly, epoxy-resin compositions were each prepared (as for comparative examples 2 and 5, the curing-agent masterbatch and jER 152 were blended to be combined at 65'C to obtain epoxy-resin compositions).
<Method for Producing Carbon-Fiber Prepreg>
The obtained epoxy-resin composition was formed into a film using Comma Coater M-500, made by Hirano Tecseed Co., Ltd., and resin film with a basis weight of 37 g/m² was prepared. The resin film was laminated on both surfaces of unidirectional carbon fibers formed by a drum winding method, and impregnated using a hot roller. Accordingly, carbon-fiber prepreg with a basis weight of 170 g/m² and a resin content of 30 mass % was obtained.
<Method 1 for Forming Carbon-Fiber Composite Material Sheet>
The obtained carbon-fiber prepreg was cut to a certain size, and a four-ply cross laminate with fiber orientations of [0°/90°]s=0°/190°/90°/0° was formed. Then, the laminate was cured in an autoclave under conditions of 130° C. for 90 minutes, with a rate of temperature rise at 2° C./min, and pressure of 0.6 MPa. Accordingly, 0.6 mm-thick carbon-fiber composite material sheet ([0/90]s) was obtained.
<Method 2 for Forming Carbon-Fiber Composite Material Sheet>
The obtained carbon-fiber prepreg was cut to a certain size, and a 14-ply cross laminate with fiber orientations of [0°]14=0°/0°/0°/0°/0°/0°/0°/0°/0°/0°/0°/0°/0°/0° was formed. Then, the laminate was cured using a pressing machine under conditions of 150° C. for 5 minutes, and pressure of 8 MPa. Accordingly, 2 mm-thick carbon-fiber composite material sheet ([0] 14) was obtained.
<Evaluation Methods>
(1) UL-94V Flammability Test (on Cured Resin Material):
An uncured epoxy-resin composition was cured in an oven at an ambient temperature of 130° C. for 120 minutes (a rate of temperature rise at 2° C./min) to obtain a 2 mm-thick resin sheet, and then processed to form a 127 mm-long×12.7 mm-wide test piece. The test piece underwent flammability testing according to the UL-94V standard using a flammability test instrument made by Suga Test Instruments Co., Ltd. Namely, a test piece was vertically mounted to a clamp, which was then brought into contact with a 20-mm flame for 10 seconds and the combustion time was measured. Such flammability testing was conducted on five test pieces, and the number of samples in which even the clamp was burnt, the maximum value among the combustion time, and the sum of combustion time of the five test pieces (total combustion time) were recorded. Also, based on the results, the cured resins were evaluated. The test pieces were evaluated to be at level V-0, V-1, V-2 or failure. V-0 is the least flammable, and the rating decreases in the order of V-1, V-2 and fail.
(2) UL-94V Flammability Test (on Carbon-Fiber Composite Material Sheet)
The same as the above UL-94V flammability test (on cured resin material) to evaluate the test sheets was conducted, except that test pieces were prepared by using the carbon-fiber composite material sheet ([0/90]s) obtained in method 1 for forming carbon-fiber composite material sheet, which was cut into 127 mm long×12.7 mm wide.
(3) Measuring Exothermic Peaks Using Differential Scanning Calorimeter (DSC) (Curability Evaluation):
Using "Q1000" made by TA Instruments as a measuring instrument, 8 to 12 mg each of uncured resin compositions was heated under conditions of nitrogen atmosphere and a rate of temperature rise at 10° C./min, and temperatures were recorded when the exothermic peaks reached maximum.

The lower the temperature of the maximum exothermic peak, the better the curability.

(4) Measuring DSC-Tg:

Using "Q1000" made by TA Instruments, 8 to 12 mg each of uncured resin compositions was heated at 130° C.×2 hours, 150° C.×2 hours or 155° C.×1 hour (a rate of temperature rise at 60° C./min each). Then, using "Q1000" made by TA Instruments as well, intermediate glass transition temperatures were measured according to JISK 7121 under conditions of a nitrogen flow rate of 50 mL/min and a rate of temperature rise at 10° C./min. The obtained values were set as DSC-Tg.

The higher the DSC-Tg value, the better the heat resistance.

(5) Measuring DMA G'-Tg:

An uncured epoxy-resin composition was cured in an oven at an ambient temperature of 150° C. for 15 minutes (a rate of temperature rise at 10° C./min) to obtain a 2 mm-thick resin sheet (the resin surface temperature at that time was measured using a thermocouple, and the duration of the resin temperature retained at 150° C. or higher was recorded) Then, the resin sheet was cut into test sheets 55 mm long×12.7 mm wide. Using "ARES-RDS" made by TA instruments and under conditions of measurement frequency of 1 Hz and a rate of temperature rise at 5° C./min, storage modulus values G' were plotted on a logarithm scale relative to temperatures, and the temperature, obtained where an approximation line in a region showing flat log G' values crosses an approximation line in a region showing transitional log G' values, was recorded as DMA G'-Tg.

The higher the DSC G'-Tg value, the better the heat resistance.

(6) Bending Test of Carbon-Fiber Composite Material Sheet:

The carbon-fiber composite material sheet ([0] 14) obtained in method 2 for forming a carbon-fiber composite sheet was formed into a test sheet 127 mm long× 12.7 mm wide with the fiber direction set as a long side. Using "Instron Universal Testing Machine 5565" made by Instron, a three-point bending test was conducted on the test sheets according to ASTM D790 to measure the bending strength and flexural modulus of elasticity.

Example 1

As specified in Table 1, an epoxy resin composition was prepared using FX-289FA as component (A), TX-0911 and jER 152 as component (B), DICY 15 as component (C) and Omicure 24 as component (D), and the composition's physical properties were evaluated. The results are shown in Table 1.

Comparative Example 1

As specified in Table 1, an epoxy resin composition was prepared the same as in example 1, except that Omicure 24 as component (D) was omitted, and the composition's physical properties were evaluated. The results are shown in Table 1.

Comparative Example 2

As specified in Table 1, an epoxy resin composition was prepared using jER 152 as component (B), DICY 15 as component (C) and DCMU 99 as the other urea compound, and the composition's physical properties were evaluated. The results are shown in Table 1.

Comparative Example 3

As specified in Table 1, an epoxy resin composition was prepared using FX-289FA as component (A), TX-0911 and jER 152 as component (B), DICY15 as component (C) and DCMU 99 as the other urea component, and the composition's physical properties were evaluated. The results are shown in Table 1.

Comparative Example 4

As specified in Table 1, an epoxy resin composition was prepared using FX-289FA as component (A), TX-0911 and jER 152 as component (B), DICY 15 as component (C) and Omicure 94 as the other urea compound, and the composition's physical properties were evaluated. The results are shown in Table 1.

Comparative Example 10

As specified in Table 1, an epoxy-resin composition was prepared using FX-289FA as component (A), TX-0911 and jER 152 as component (B), DICY 15 as component (C) and Omicure 52 as the other urea compound, and the composition's physical properties were evaluated. The results are shown in Table 1.

Comparative Example 5

As specified in Table 2, an epoxy-resin composition was prepared using and jER 152 as component (B), DICY15 as component (C) and Omicure 24 as component (D), and the composition's physical properties were evaluated. The results are shown in Table 2.

Comparative Example 6

As specified in Table 2, an epoxy-resin composition was prepared the same as in example 1, except that TX-0911 and jER 152 were used as component (13) and the amount of FX-289FA as component (A) was reduced, and the composition's physical properties were evaluated. The results are shown in Table 2.

Examples 2 to 5

Epoxy-resin compositions were prepared the same as in example 1, except that TX-0911 and jER 152 were used as component (B) and the amounts of FX-289FA as component (A) were increased or reduced respectively as specified in Table 2, and the compositions' physical properties were evaluated. The results are shown in Table 2.

Comparative Example 7

As specified in Table 2, an epoxy-resin composition was prepared the same as in example 6, except that the amount of Omicure 24 as component (D) was reduced, and the composition's physical properties were evaluated. The results are shown in Table 2.

Example 6

As specified in Table 2, an epoxy-resin composition was prepared using FX-289FA as component (A), TX-0911 and jER 152 as component (B), DICY 15 as component (C) and Omicure 24 as component (D), and the composition's physical properties were evaluated. The results are shown in Table 2.

Comparative Examples 8, 9

Epoxy-resin compositions were prepared the same as in example 1, except that the amounts of Omicure 24 as component (D) were reduced respectively as specified in Table 3, and the compositions' physical properties were evaluated. The results are shown in Table 3.

Examples 7 to 12, 28

Epoxy-resin compositions were prepared the same as in example 1, except that the amounts of Omicure 24 as component (D) were increased respectively as specified in Table 3, and the compositions' physical properties were evaluated. The results are shown in Table 3.

Example 13

An epoxy-resin composition was prepared the same as in example 9, except that the amount of DICY 15 as component (C) was reduced as specified in Table 4, and the composition's physical properties were evaluated. The results are shown in Table 4.

Examples 14, 15

Epoxy-resin compositions were prepared the same as in example 13, except that the amounts of Omicure 24 as component (D) were increased respectively as specified in Table 4, and the compositions' physical properties were evaluated. The results are shown in Table 4.

Example 16

An epoxy-resin composition was prepared the same as in example 9, except that the amount of DICY 15 as component (C) and the amount of Omicure 24 as component (D) were increased as specified in Table 4, and the composition's physical properties were evaluated. The results are shown in Table 4.

Examples 17 to 20

Epoxy-resin compositions were prepared using FX-289FA as component (A), TX-0911, jER 1032H60 and jER 630 as component (B), DICY 15 as component (C), Omicure 24 as component (D), jER 828 as another epoxy resin, and YP-70 as a thermoplastic resin as specified in Table 5, and the compositions' physical properties were evaluated. The results are shown in Table 5.

Example 21

An epoxy-resin composition was prepared using FX-289FA as component (A), TX-0911, jER 1032H60 and jER 630 as component (B), DICY 15 as component (C), Omicure 24 as component (D), jER 828 as another epoxy resin, and YP-70 as a thermoplastic resin as specified in Table 5, and the composition's physical properties were evaluated. The results are shown in Table 5.

In addition, a carbon-fiber composite material sheet was formed and its physical properties were evaluated. The results were shown in Table 6.

Examples 22, 23

Epoxy-resin compositions were prepared using FX-289FA as component (A), TX-0911 and jER 604 as component (B), DICY 15 as component (C), Omicure 24 as component (D), jER 828 as another epoxy resin, and YP-70 as a thermoplastic resin as specified in Table 5, and the compositions' physical properties were evaluated. The results are shown in Table 5.

Example 24

An epoxy-resin composition was prepared using FX-289FA as component (A), TX-0911, jER 152, N-540 and jER 630 as component (B), DICY 15 as component (C), Omicure 24 as component (D), and E2020P micro as a thermoplastic resin as specified in Table 5, and the composition's physical properties were evaluated. The results are shown in Table 5.

Example 25

As specified in Table 5, an epoxy-resin composition was prepared the same as in example 24 except that E2020P micro as a thermoplastic resin was replaced with YP-70, and the composition's physical properties were evaluated. The results are shown in Table 5.

Example 26

An epoxy-resin composition was prepared using FX-289FA as component (A), TX-0911, jER 1032H60 and jER 604 as component (B), DICY 15 as component (C), Omicure 24 as component (D), jER 828 as another epoxy resin, and YP-70 as a thermoplastic resin as specified in Table 5, and the composition's physical properties were evaluated. The results are shown in Table 5.

Example 27

An epoxy-resin composition was prepared using FX-289FA as component (A), TX-0911, jER 1032H60 and jER 604 as component (B), DICY 15 as component (C), Omicure 24 as component (D), jER 828 and jER 807 as other epoxy resins, and YP-70 as a thermoplastic resin as specified in Table 5, and the composition's physical properties were evaluated. The results are shown in Table 5.

In addition, a carbon-fiber composite material sheet was formed and its physical properties were evaluated. The results are shown in Table 6.

TABLE 1

|  |  | comparative example 1 | comparative example 2 | comparative example 3 | comparative example 4 | example 1 | comparative example 10 |
|---|---|---|---|---|---|---|---|
| component (A) | FX-289FA | 40 | — | 40 | 40 | 40 | 40 |
| component (B) | TX-0911 | 40 | — | 40 | 40 | 40 | 40 |
|  | jER 152 | 60 | 100 | 60 | 60 | 60 | 60 |
| component (C) | DICY15 | 7 | 7 | 7 | 7 | 7 | 7 |
| component (D) | Omicure 24 | — | — | — | — | 5 | — |
| other urea | DCMU 99 | — | 8.8 | 8.8 | — | — | — |
| compound | Omicure 94 | — | — | — | 6.2 | — | — |
|  | Omicure 52 | — | — | — | — | — | 6.4 |
| (phosphorus atom content) (mass %) |  | 2.0 | 0 | 1.9 | 1.9 | 1.9 | 1.9 |
| (urea equivalent to epoxy) |  | 0 | 0.07 | 0.07 | 0.07 | 0.07 | 0.07 |
| (urea equivalent to phosphorus) |  | 0 | ∞ | 0.40 | 0.40 | 0.40 | 0.40 |
| physical properties | flame retardance (cured resin composition) | — | fail | V-0 | V-0 | V-0 | V-0 |
|  | DSC exothermic peak (° C.) | 187.2 | 156.3 | 161.2 | 160.2 | 156.5 | 160.8 |
|  | DSC-Tg (° C.) cured at 130° C. × 2 h | — | 138 | 138 | 141 | 146 | 142 |
|  | DSC-Tg (° C.) cured at 150° C. × 2 h | — | — | 134 | 142 | 153 | 142 |

TABLE 2

|  |  | comparative example 5 | comparative example 6 | example 2 | example 3 | example 4 | example 5 | comparative example 7 | example 6 |
|---|---|---|---|---|---|---|---|---|---|
| component (A) | FX-289FA | — | 5 | 10 | 20 | 30 | 60 | 80 | 80 |
| component (B) | TX-0911 | — | 5 | 10 | 20 | 30 | 60 | 80 | 80 |
|  | jER 152 | 100 | 95 | 90 | 80 | 70 | 40 | 20 | 20 |
| component (C) | DICY 15 | 7 | 7 | 7 | 7 | 7 | 7 | 7 | 7 |
| component (D) | Omicure 24 | 5 | 5 | 5 | 5 | 5 | 5 | 5 | 10 |
| (phosphorus atom content) (mass %) |  | 0 | 0.3 | 0.6 | 1.1 | 1.6 | 2.6 | 3.1 | 3.0 |
| (urea equivalent to epoxy) |  | 0.07 | 0.07 | 0.07 | 0.07 | 0.07 | 0.07 | 0.07 | 0.13 |
| (urea equivalent to phosphorus) |  | ∞ | 3.22 | 1.61 | 0.80 | 0.54 | 0.27 | 0.20 | 0.40 |
| physical properties | flame retardance (cured resin composition) | fail | fail | V-1 | V-1 | V-0 | V-0 | V-0 | V-0 |
|  | DSC exothermic peak (° C.) | 141.2 | 148.6 | 150.9 | 154.9 | 155.4 | 159.4 | 170.8 | 153 |
|  | DSC-Tg (° C.) cured at 130° C. × 2 h | 148 | 150 | 151 | 151 | 148 | 143 | 132 | 142 |
|  | DSC-Tg (° C.) cured at 150° C. × 2 h | 150 | 155 | 156 | 157 | 155 | 146 | 135 | 143 |

TABLE 3

|  |  | comparative example 8 | comparative example 9 | example 7 | example 8 | example 9 | example 10 | example 11 | example 12 | example 28 |
|---|---|---|---|---|---|---|---|---|---|---|
| component (A) | FX-289FA | 40 | 40 | 40 | 40 | 40 | 40 | 40 | 40 | 40 |
| component (B) | TX-0911 | 40 | 40 | 40 | 40 | 40 | 40 | 40 | 40 | 40 |
|  | jER 152 | 60 | 60 | 60 | 60 | 60 | 60 | 60 | 60 | 60 |
| component (C) | DICY 15 | 7 | 7 | 7 | 7 | 7 | 7 | 7 | 7 | 7 |
| component (D) | Omicure 24 | 1 | 3 | 6 | 9 | 12 | 15 | 18 | 23 | 37.3 |
| (phosphorus atom content) (mass %) |  | 2.0 | 2.0 | 1.9 | 1.9 | 1.9 | 1.8 | 1.8 | 1.7 | 1.6 |
| (urea equivalent to epoxy) |  | 0.01 | 0.04 | 0.08 | 0.12 | 0.16 | 0.20 | 0.24 | 0.30 | 0.49 |
| (urea equivalent to phosphorus) |  | 0.08 | 0.24 | 0.48 | 0.72 | 0.97 | 1.21 | 1.45 | 1.85 | 3.00 |
| physical properties | flame retardance (cured resin composition) | V-0 | V-0 | V-0 | V-0 | V-0 | V-0 | V-0 | V-0 | — |
|  | DSC exothermic peak (° C.) | 179.3 | 166.5 | 155.0 | 151.1 | 148.3 | 147.8 | 148.0 | 144.6 | 142.4 |
|  | DSC-Tg (° C.) cured at 130° C. × 2 h | not cured | 138 | 150 | 149 | 146 | 146 | 145 | 142 | 121 |
|  | DSC-Tg (° C.) cured at 150° C. × 2 h | 131 | 147 | 154 | 153 | 144 | 133 | 132 | 128 | 101 |

TABLE 4

|  |  | example 13 | example 14 | example 15 | example 16 |
|---|---|---|---|---|---|
| component (A) | FX-289FA | 40 | 40 | 40 | 40 |
| component (B) | TX-0911 | 40 | 40 | 40 | 40 |
|  | jER 152 | 60 | 60 | 60 | 60 |
| component (C) | DICY 15 | 6 | 6 | 6 | 8 |
| component (D) | Omicure 24 | 12 | 14 | 16 | 13.7 |
| (phosphorus atom content) (mass %) |  | 1.9 | 1.9 | 1.8 | 1.8 |
| (urea equivalent to epoxy) |  | 0.16 | 0.18 | 0.21 | 0.18 |
| (urea equivalent to phosphorus) |  | 0.97 | 1.13 | 1.29 | 1.10 |
| physical properties | flame retardance (cured resin composition) | V-0 | V-0 | V-0 | V-0 |
|  | DSC exothermic peak (° C.) | 153.0 | 154.6 | 153.0 | 153.0 |
|  | DSC-Tg (° C.) cured at 130° C. × 2 h | 150 | 148 | 149 | 150 |
|  | DSC-Tg (° C.) cured at 150° C. × 2 h | 151 | 146 | 145 | 149 |

TABLE 5

|  |  | example 17 | example 18 | example 19 | example 20 | example 21 | example 22 | example 23 | example 24 | example 25 | example 26 | example 27 |
|---|---|---|---|---|---|---|---|---|---|---|---|---|
| component (A) | FX-289FA | 40 | 40 | 40 | 40 | 40 | 40 | 40 | 36 | 36 | 30 | 30 |
| component (B) | TX-0911 | 40 | 40 | 40 | 40 | 40 | 40 | 40 | 36 | 36 | 30 | 30 |
|  | jER 152 | — | — | — | — | — | — | — | 24 | 24 | — | — |
|  | jER 1032H60 | 8 | 10 | 12 | 14 | 16 | — | — | — | — | 31 | 30 |
|  | N-540 | — | — | — | — | — | — | — | 25 | 25 | — | — |
|  | jER 630 | 10 | 12.5 | 15 | 17.5 | 20 | — | — | 15 | 15 | — | — |
|  | jER 604 | — | — | — | — | — | 36 | 27 | — | — | 15 | 8 |
| component (C) | DICY 15 | 8 | 7.5 | 7.7 | 7.8 | 8 | 8 | 7.7 | 7 | 7 | 8 | 8 |
| component (D) | Omicure 24 | 12 | 11.3 | 11.5 | 11.8 | 13.7 | 12 | 11.5 | 14 | 14 | 12 | 12 |
| other epoxy resin | jER 828 | 42 | 37.5 | 33 | 28.5 | 24 | 24 | 33 | — | — | 24 | 24 |
|  | jER 807 | — | — | — | — | — | — | — | — | — | — | 8 |
| thermoplastic resin (E) | YP-70 | 11.1 | 11.1 | 11.1 | 11.1 | 11.1 | 11.1 | 11.1 | — | 10 | 8.3 | 8.3 |
|  | E2020P micro | — | — | — | — | — | — | — | 10 | — | — | — |
| (phosphorus atom content) (mass %) |  | 1.7 | 1.7 | 1.7 | 1.7 | 1.7 | 1.7 | 1.7 | 1.6 | 1.6 | 1.4 | 1.4 |
| (urea equivalent to epoxy) |  | 0.14 | 0.14 | 0.14 | 0.14 | 0.14 | 0.14 | 0.14 | 0.16 | 0.16 | 0.15 | 0.15 |
| (urea equivalent to phosphorus) |  | 0.97 | 0.91 | 0.93 | 0.95 | 1.10 | 0.97 | 0.93 | 1.25 | 1.25 | 1.29 | 1.29 |
| physical properties | flame retardance (cured resin composition) | V-0 | V-0 | V-0 | V-0 | V-0 | V-0 | V-0 | V-0 | V-0 | V-0 | V-0 |
|  | DSC exothermic peak (° C.) | 154.4 | 154.6 | 153.6 | 152.5 | 151.3 | 154.5 | 158.0 | 154.0 | 146.9 | 147.2 | 144.9 |
|  | DMA G'-Tg (° C.) cured at 150° C. × 15 min (retention time of resin at 150° C. or higher) | 134 (4 min) | 139 (4 min) | 144 (4 min) | 147 (3 min) | 151 (5 min) | 152 (3 min) | 147 (4 min) | — | — | 163 (5 min) | 154 (3 min) |

TABLE 6

|  |  | example 21 | example 27 |
|---|---|---|---|
| component (A) | FX-289FA | 40 | 30 |
| component (B) | TX-0911 | 40 | 30 |
|  | jER 1032H60 | 16 | 30 |
|  | jER 630 | 20 | — |
|  | jER 604 | — | 8 |
| component (C) | DICY 15 | 8 | 8 |
| component (D) | Omicure 24 | 13.7 | 12 |
| other epoxy resin | jER 828 | 24 | 24 |
|  | jER 807 | — | 8 |
| thermoplastic resin (E) | YP-70 | 11.1 | 8.3 |
| (phosphorus atom content) (mass %) |  | 1.7 | 1.4 |
| (urea equivalent to epoxy) |  | 0.14 | 0.15 |
| (urea equivalent to phosphorus) |  | 1.10 | 1.29 |
| physical properties | flame retardance (carbon-fiber composite material sheet) | V-0 | V-0 |
|  | bending strength (MPa) of carbon-fiber composite material | 2030 | 2080 |
|  | flexural modulus of elasticity (GPa) of carbon-fiber composite material | 143 | 145 |

In Tables 1 to 6, "phosphorus atom content (mass %)," "urea equivalent to epoxy," and "urea equivalent to phosphorus" indicate the phosphorus atom content (mass %) in an epoxy-resin composition, a ratio of the amount of substance of the urea group derived from component (D) to the amount of substance of epoxy groups contained in an epoxy-resin composition, and a ratio of the amount of substance of the urea group derived from component (D) to the amount of substance of phosphorus atoms derived from component (A).

As shown in the above results, epoxy-resin compositions in examples 1 to 28, which contain components (A) to (D), "urea equivalent to phosphorus" at 0.25 or greater, and at least 7 parts by mass of component (A) to 100 parts by mass of epoxy resin other than component (A) (epoxy resin in component (B) and other epoxy resins), each showed an exothermic peak temperature of 160° C. or lower and excellent curability. The cured materials also showed excellent flame retardance and heat resistance. In addition, carbon-fiber composite materials, formed by curing prepreg made of the epoxy-resin compositions in examples 21 and 27, also showed excellent flame retardance as the cured materials, and the compositions' mechanical characteristics were also excellent.

By contrast, comparative example 1, which does not contain component (D), showed low curability. Comparative example 2, which does not contain component (A) and contains DCMU 99 in place of component (D), showed low flame retardance and heat resistance. Comparative examples 3, 4 and 10, which contain DCMU 99, Omicure 94 or Omicure 52 in place of component (D), showed low curability and low heat resistance. Comparative example 5, which does not contain component (A), and comparative example 6, which contains 5 parts by mass of component (A) relative to 100 parts by mass of epoxy resin other than component (A), each showed low flame retardance. Comparative examples 7 to 9, whose "urea equivalent to phosphorus" is lower than 0.25, showed low curability and low heat resistance, and comparative example 8, whose "urea equivalent to phosphorus" is lower than 0.08, did not cure under the condition of 130° C.×2 hours.

INDUSTRIAL APPLICABILITY

The embodiments of the present invention provide epoxy-resin compositions and prepreg which show excellent curability and have excellent flame retardance and heat resistance without containing a halogen-based flame-retardant agent, red phosphorus, phosphate or phosphazene compound, while providing fiber-reinforced composite materials obtained using such prepreg as well as providing housing for electronic/electrical devices.

The invention claimed is:

1. An epoxy-resin composition, comprising:
 a component (A), which is a phosphorus compound that has a phosphorus atom content of at least 1.0 mass % but no more than 8.0 mass %;
 wherein the component (A) is a phosphorus modified epoxy resin comprising a compound (b) represented by formula (b):

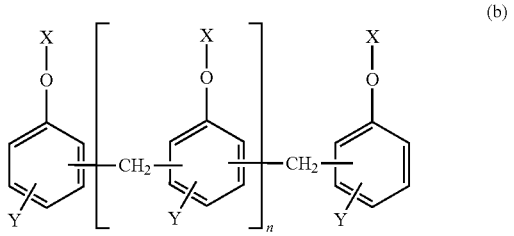

(b)

n represents an integral number of zero or greater;
X represents a group shown in formulas (I), (II) or (III):

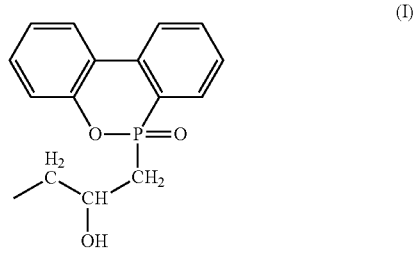

(I)

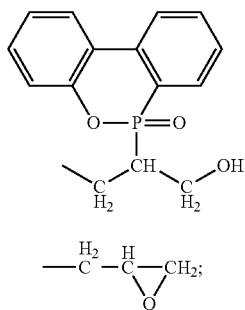

(II)

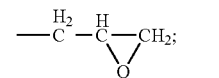

(III)

at least one of the X groups is formula (III),
(n+2) X groups may be the same or different, with the proviso that at least one of the (n+2) X groups is a group of formula (I) or (II); and
Y represents a (—H) or (—CH$_3$) group, such that (n+2) Y groups may be the same or different;
a component (B) is at least one selected from the group consisting of a trisphenolmethane epoxy resin, an aminophenol epoxy resin, a diaminodiphenylmethane epoxy resin, a novolac epoxy resin and a modified epoxy resin thereof;
a component (C), which is dicyandiamide; and
a component (D), which is 1,1'(4-methyl-1,3-phenylene) bis(3,3-dimethylurea) wherein:
the amount of urea groups derived from the component (D) is at least 0.40 times to 1.85 times or lower than a molar amount of phosphorus atoms derived from the component (A); and
the amount of the component (A) to 100 parts by mass of the epoxy-resin composition excluding the component (A) is 10 parts by mass to 80 parts by mass;
the amount of the component (B) is 58 parts by mass to 100 parts by mass, relative to 100 parts by mass of epoxy resin contained in the epoxy resin composition excluding the component (A);
the ratio of the active hydrogen equivalent of component (C) is 0.5 to 0.8 relative to the epoxy equivalent of the epoxy-resin composition excluding component (C), and
the molar amount of the urea group from the component (D) is 0.03 to 0.25 times the molar amount of the epoxy groups in the epoxy resin composition.

2. The epoxy-resin composition according to claim 1, wherein the molar amount of urea groups derived from the component (D) is at least 0.48 times, but no more than 0.90 times, the molar amount of phosphorus atoms derived from the component (A).

3. The epoxy-resin composition according to claim 1, comprising a phosphorus atom content of 0.4 mass % to 3.5 mass %.

4. The epoxy-resin composition according to claim 1, further comprising a thermoplastic resin (E).

5. The epoxy-resin composition according to claim 4, wherein thermoplastic resin (E) is phenoxy resin.

6. The epoxy-resin composition according to claim 1, further comprising:
a component (F), which is a second epoxy resin comprising at least three epoxy groups, and which does not correspond to the component (A) or the component (B) and does not include the component (A) or the component (B).

7. The epoxy-resin composition according to claim 6, further comprising:
a component (G), which is a third epoxy resin comprising at least three epoxy groups, and which does not correspond to the component (A), the component (B) or the component (F) and does not include the component (A), the component (B) or the component (F).

8. The epoxy-resin composition according to claim 1, wherein the DSC exothermic peak is from 144.6° C. to 159.4° C.

9. The epoxy-resin composition according to claim 1, wherein the DSC-Tg value when the epoxy-resin composition is cured at 130° C.×2h is from 142° C. to 151° C.

10. The epoxy-resin composition according to claim 8, wherein the DSC-Tg value when the epoxy-resin composition is cured at 130° C.×2h is from 142° C. to 151° C.

11. A prepreg formed by impregnating reinforcing fiber with the epoxy-resin composition according to claim 1.

12. A fiber-reinforced composite material obtained by curing the prepreg according to claim 11.

13. A housing for an electrical/electronic device, wherein the housing is partially or entirely formed with the fiber-reinforced composite material according to claim 12.

* * * * *